(12) United States Patent
Stadler (10) Patent No.: US 7,573,295 B1
(45) Date of Patent: Aug. 11, 2009

(54) HARD MACRO-TO-USER LOGIC INTERFACE

(75) Inventor: Laurent F. Stadler, San Francisco, CA (US)

(73) Assignee: XILINX, Inc., San Jose, CA (US)

( * ) Notice: Subject to any disclaimer, the term of this patent is extended or adjusted under 35 U.S.C. 154(b) by 0 days.

(21) Appl. No.: 11/803,521

(22) Filed: May 14, 2007

(51) Int. Cl.
*G06F 7/38* (2006.01)
*H03K 19/177* (2006.01)

(52) U.S. Cl. .......................................... 326/40; 326/38

(58) Field of Classification Search ............. 326/38–41; 702/120; 703/23; 713/1
See application file for complete search history.

(56) References Cited

U.S. PATENT DOCUMENTS

| | | |
|---|---|---|
| 5,703,498 A | 12/1997 | Gould et al. |
| 5,781,756 A | 7/1998 | Hung |
| 5,857,086 A | 1/1999 | Horan et al. |
| 5,892,961 A | 4/1999 | Trimberger |
| 6,067,595 A | 5/2000 | Lindenstruth |
| 6,160,418 A | 12/2000 | Burnham |
| 6,204,687 B1 | 3/2001 | Schultz et al. |
| 6,241,400 B1 | 6/2001 | Melo et al. |
| 6,292,021 B1 | 9/2001 | Furtek et al. |
| 6,294,925 B1 | 9/2001 | Chan et al. |
| 6,340,897 B1 | 1/2002 | Lytle et al. |
| 6,522,167 B1 | 2/2003 | Ansari et al. |
| 6,792,578 B1 | 9/2004 | Brown et al. |
| 6,903,575 B1 | 6/2005 | Davidson et al. |
| 6,915,365 B2 | 7/2005 | Creta et al. |
| 6,976,160 B1 * | 12/2005 | Yin et al. ...................... 713/1 |
| 7,003,423 B1 * | 2/2006 | Kabani et al. ............... 702/120 |
| 7,043,570 B2 | 5/2006 | Fry et al. |
| 7,126,372 B2 * | 10/2006 | Vadi et al. ..................... 326/38 |
| 7,190,190 B1 * | 3/2007 | Camarota et al. ............. 326/38 |
| 7,200,832 B2 | 4/2007 | Butt et al. |
| 7,274,213 B1 | 9/2007 | Meyer et al. |
| 7,328,335 B1 | 2/2008 | Sundararajan et al. |
| 7,353,162 B2 * | 4/2008 | Huang et al. .................. 703/23 |

OTHER PUBLICATIONS

"PCI Express PIPE Endpoint LogiCORE Product Specification," DS321 (v1.1), Apr. 11, 2005, pp. 1-14, Xilinx, Inc.
"PCI Express Endpoint Cores v3.4 Product Specification," DS506, Feb. 15, 2007, pp. 1-20, Xilinx, Inc.
U.S. Appl. No. 11/803,516, filed May 14, 2007, Kolze, Paige A., et al., Configurable Interface, Xilinx, Inc. 2100 Logic Drive, San Jose, Ca 95124.
U.S. Appl. No. 11/803,522, filed May 14, 2007, Tran, Dai D., et al., Interface Device Reset, Xilinx, Inc. 2100 Logic Drive, San Jose, Ca 95124.

(Continued)

*Primary Examiner*—James H. Cho
*Assistant Examiner*—Crystal L Hammond
(74) *Attorney, Agent, or Firm*—E. Eric Webostad; Justin Liu (57) ABSTRACT

A hard macro-to-user logic interface of an integrated circuit is described. The integrated circuit includes a core as an application specific circuit block with a transaction interface of a first bit width and includes programmable logic capable of being programmed to instantiate user logic. The user logic has a user interface of a second bit width substantially less than the first bit width. A wrapper circuit couples the user interface and the transaction interface for coupling the core to the user logic.

18 Claims, 7 Drawing Sheets

OTHER PUBLICATIONS

U.S. Appl. No. 11/803,556, filed May 14, 2007, McCarthy, Patrick C., et al., Interface Device Lane Configuration, Xilinx, Inc. 2100 Logic Drive, San Jose, Ca 95124.

U.S. Appl. No. 11/803,517, filed May 14, 2007, Case, Jerry A., Reconfiguration of a Hard Macro Via Configuration Registers, Xilinx, Inc. 2100 Logic Drive, San Jose, Ca 95124.

* cited by examiner

HARD MACRO-TO-USER LOGIC INTERFACE

CROSS-REFERENCE TO RELATED APPLICATIONS

This application is related to the following co-pending U.S. patent applications: U.S. patent application entitled "Interface Lane Device Configuration," by Patrick C. McCarthy, et al., U.S. patent application entitled "Interface Device Reset," by Dai D. Tran, et al., U.S. patent application entitled "Configurable Interface" by Paige A. Kolze, et al., and U.S. patent application entitled "Reconfiguration of a Hard Macro via Configuration Registers," by Jerry A. Case, each of which was filed on the same day as the present application and each of which is assigned to the assignee of the present application. The entire contents of each of the above-referenced co-pending patent applications are incorporated herein by reference for all purposes.

FIELD OF THE INVENTION

One or more aspects of the invention relate generally to integrated circuits, and, more particularly, to a hard macro-to-user logic interface of a programmable logic device.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. Notably, as used herein, "include" and "including" mean including without limitation.

One such FPGA is the Xilinx Virtex™ FPGA available from Xilinx, Inc., 2100 Logic Drive, San Jose, Calif. 95124. Another type of PLD is the Complex Programmable Logic Device ("CPLD"). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. Other PLDs are programmed by applying a processing layer, such as a metal layer, that programmably interconnects the various elements on the device. These PLDs are known as mask programmable devices. PLDs can also be implemented in other ways, for example, using fuse or antifuse technology. The terms "PLD" and "programmable logic device" include but are not limited to these exemplary devices, as well as encompassing devices that are only partially programmable.

For purposes of clarity, FPGAs are described below though other types of PLDs may be used. FPGAs may include one or more embedded microprocessors. For example, a microprocessor may be located in an area reserved for it, generally referred to as a "processor block."

Heretofore, performance of a design instantiated in programmable logic of an FPGA ("FPGA fabric") using a Peripheral Component Interconnect ("PCI") Express ("PCIe") internal to such FPGA was limited to performance of a PCIe design for instantiation in FPGA fabric ("soft core"). Additional details regarding examples of PCIe soft cores are available from Xilinx, Inc. of San Jose, Calif. and are described in "PCI Express PIPE Endpoint LogiCORE Product Specification," DS321 (v1.1), Apr. 11, 2005 and in "PCI Express Endpoint Cores v3.4 Product Specification," DS506, Feb. 15, 2007, both available from Xilinx, Inc.

PCIe soft cores have been implemented as "Endpoint" architectures. Target applications for such Endpoint architecture include: test equipment, consumer graphics boards, medical imaging equipment, data communication networks, telecommunication networks, broadband deployments, cross-connects, workstation and mainframe backbones, network interface cards, chip-to-chip and backplane interconnect, crossbar switches, wireless base stations, high bandwidth digital video, and high bandwidth server applications, among other known add-in cards, host bus adapters, and other known applications.

Accordingly, it would be desirable and useful to provide a PCIe Endpoint internal to an FPGA having enhanced performance over that of a PCIe soft core instantiated in FPGA fabric.

SUMMARY OF THE INVENTION

One or more aspects of the invention generally relate to a hard macro-to-user logic interface of a programmable logic device.

An aspect of the invention is an integrated circuit including a core located in a programmable logic device as an application specific circuit block. The core has a transaction interface having a first bit width. The integrated circuit also includes programmable logic capable of being programmed to instantiate user logic. The user logic has a user interface for coupling with the transaction interface, the user interface having a second bit width substantially less than the first bit width. A wrapper circuit couples the user interface and the transaction interface for coupling the core to the user logic. The wrapper circuit is configured to couple first information of the first bit width from the transaction interface to the user interface and is configured to couple second information of the second bit width from the user interface to the transaction interface.

Another aspect of the invention is a method for coupling a user design instantiated in programmable logic and a hard macro, both of which are implemented in an integrated circuit. A phase signal is generated which alternates between a first logic state and a second logic state synchronously with reference to a first clock signal. Output data associated with the hard macro is sent to a wrapper block. The output data is received in first pairs, each of which includes first output data and second output data. The output data in the wrapper block is first registered responsive to a second clock signal which is substantially slower than the first clock signal. The output data is output from the wrapper block to the user design responsive to the phase signal. The output data output from the wrapper block is output as first bitstreams, each of which includes a first alternating sequence of the first output data and the second output data for each of the first pairs associated therewith. Input data associated with the user design is sent to the wrapper block in second bitstreams. The input data is provided in second pairs, wherein each second pair of the second pairs includes first input data and second input data. Each second bitstream of the second bitstreams includes a second alternating sequence of the first input data and the second input data for each of the second pairs associated therewith. A first portion of the input data in the wrapper block is second registered responsive to the first clock signal and the phase signal. A second portion of the input data in the wrapper block is third registered responsive to the second clock signal. The first portion of the input data in the wrapper block is fourth registered responsive to the second clock signal. The input data is output from the wrapper block to the hard macro responsive to the second clock signal, the input data output from the wrapper block being output as the first input data and the second output data respectively from the fourth registering and the third registering. The first input data and the second input data are output from the wrapper block as separate signals for each of the second bitstreams.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
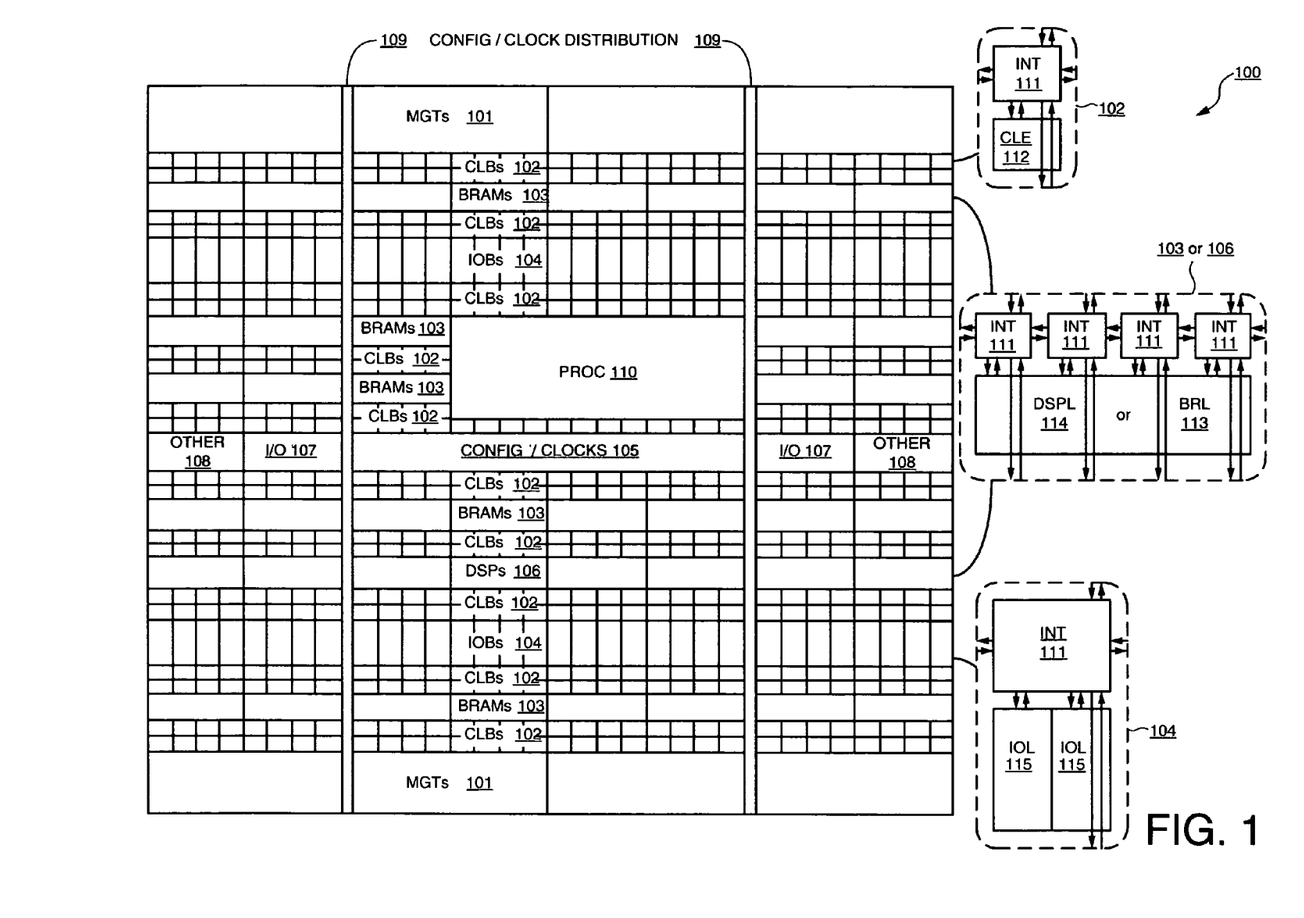
FIG. 1 is a simplified block diagram depicting an exemplary embodiment of a columnar Field Programmable Gate Array ("FPGA") architecture in which one or more aspects of the invention may be implemented.

FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output ports ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element 111 in each adjacent tile. Therefore, the programmable interconnect elements 111 taken together implement the programmable interconnect structure for the illustrated FPGA. Each programmable interconnect element 111 also includes the connections to and from any other programmable logic element(s) within the same tile, as shown by the examples included at the right side of FIG. 1.

For example, a CLB 102 can include a configurable logic element ("CLE") 112 that can be programmed to implement user logic plus a single programmable interconnect element 111. A BRAM 103 can include a BRAM logic element ("BRL") 113 in addition to one or more programmable interconnect elements 111. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element ("DSPL") 114 in addition to an appropriate number of programmable interconnect elements 111. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 are manufactured using metal layered above the various illustrated logic blocks, and typically are not confined to the area of the I/O logic element 115.

In the pictured embodiment, a columnar area near the center of the die (shown shaded in FIG. 1) is used for configuration, I/O, clock, and other control logic. Vertical areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the right side of FIG. 1 are purely exemplary. For example, in an actual FPGA more than one adjacent column of CLBs is typically included wherever the CLBs appear, to facilitate the efficient implementation of user logic. FPGA 100 illustratively represents a columnar architecture, though FPGAs of other architectures, such as ring architectures for example, may be used. FPGA 100 may be a Virtex-4™ FPGA from Xilinx of San Jose, Calif.

Figure 2:
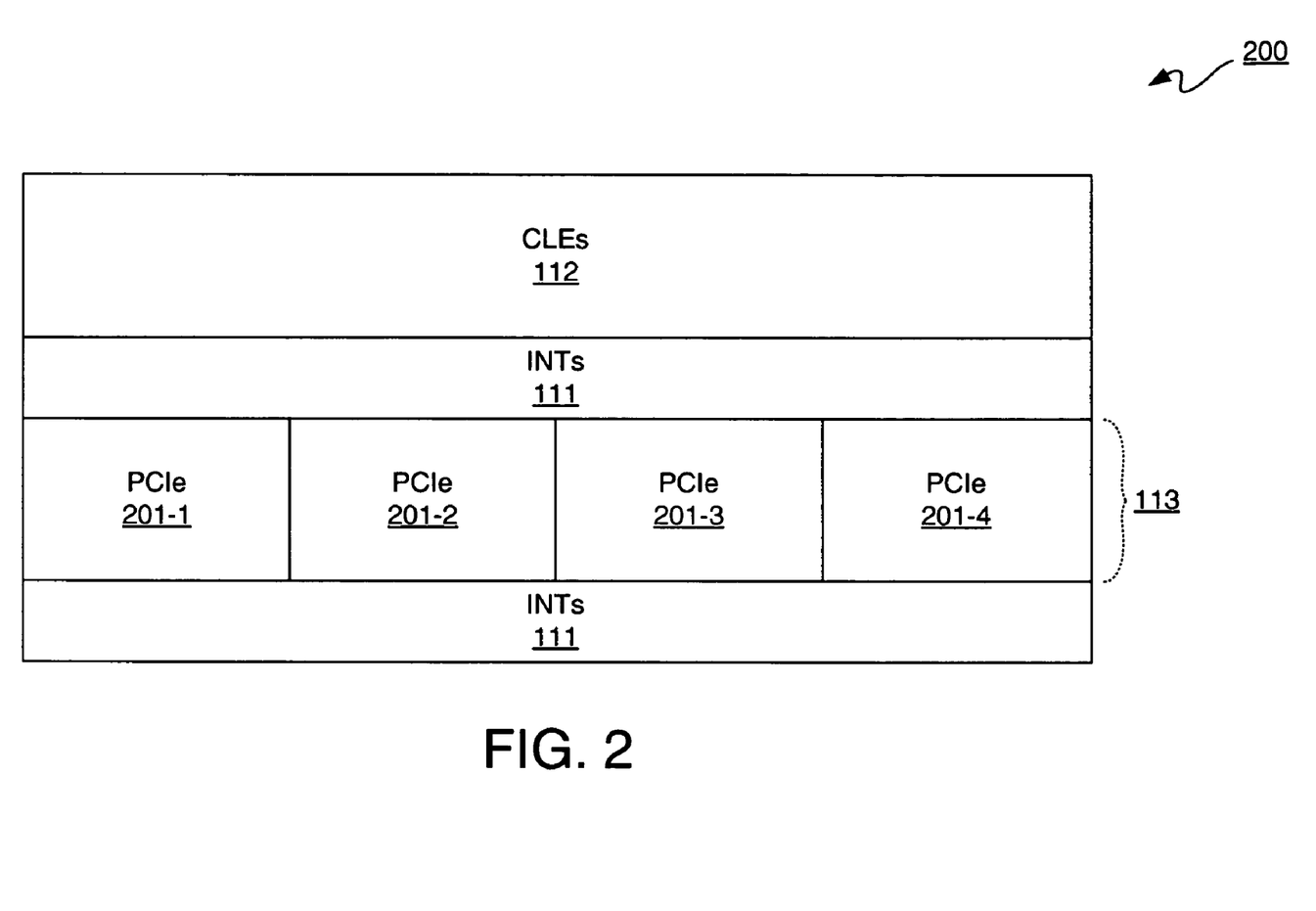
FIG. 2 is a block diagram depicting an exemplary embodiment of a portion of an FPGA with a column of Peripheral Component Interconnect ("PCI") Express ("PCIe") Application Specific Integrated Circuit ("ASIC") cores, namely PCIe hard cores.

FIG. 2 is a block diagram depicting an exemplary embodiment of a portion of an FPGA 200. FPGA 200 may be substantially similar to FPGA 100 of FIG. 1. However, in place of a column of BRLs 113 are located PCIe Application Specific Integrated Circuit ("ASIC") cores, namely PCIe hard cores. Notably, rather than using a column of BRLs 113, other columns in FPGA 100 of FIG. 1 may be used. PCIe hard cores 201-1 through 201-4 are illustratively shown between two columns of INTs 111. Though four PCIe hard cores 201-1 through 201-4 are illustratively shown, fewer or more than four PCIe hard cores may be implemented in an FPGA.

Figure 3:
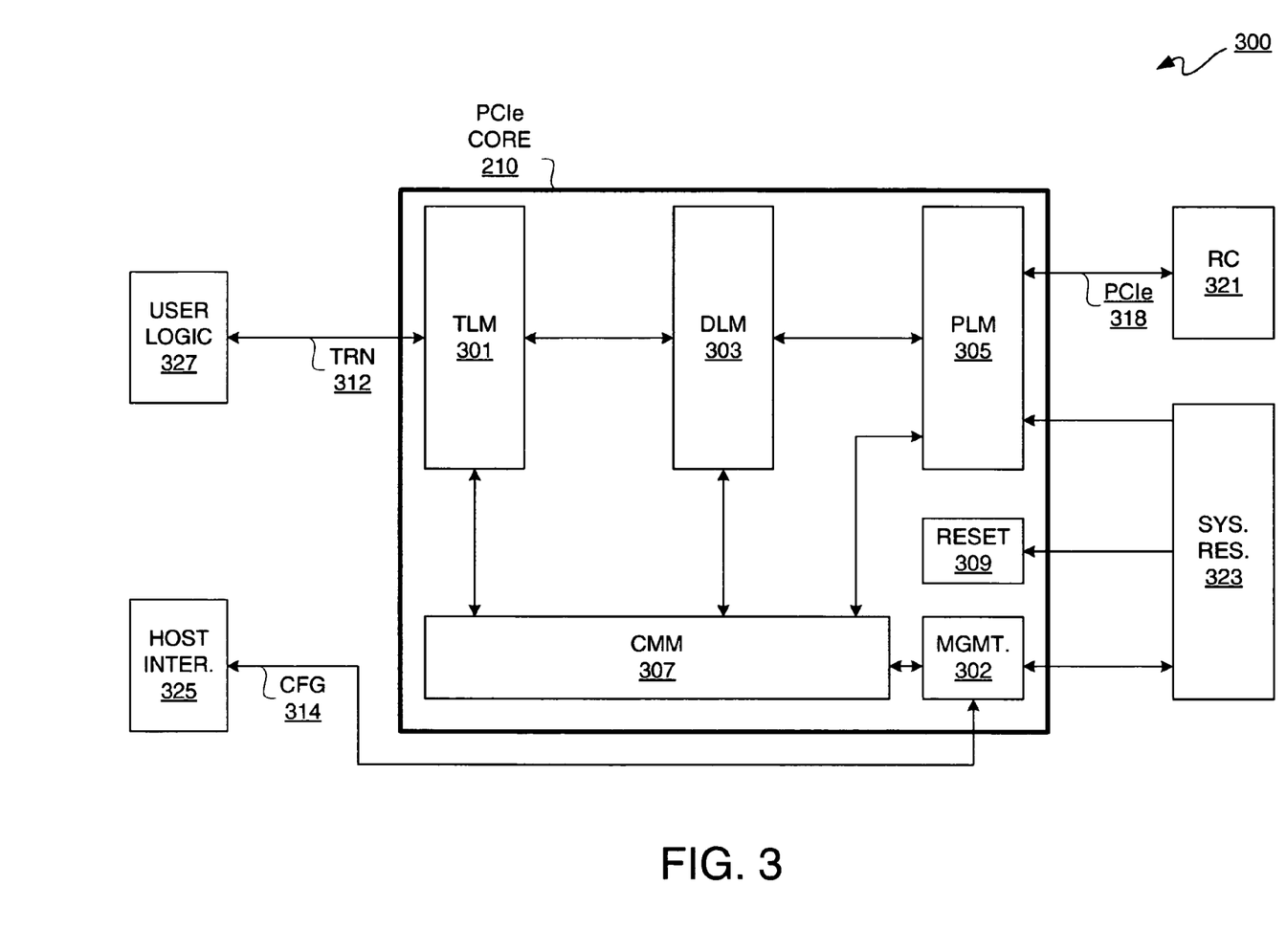
FIG. 3 is a block diagram depicting an exemplary embodiment of a PCIe system.

FIG. 3 is a block diagram depicting an exemplary embodiment of PCIe system 300. PCIe system 300 may be implemented in an FPGA. PCIe system 300 includes a PCIe hard core ("PCIe core") 210, which may be a PCIe hard core of PCIe hard cores 201-1 through 201-4 of FIG. 2, coupled to a Root Complex 321, user logic 327, host interface 325, and system resources 323. PCIe core 210 includes a physical layer module ("PLM") 305, a datalink layer module ("DLM") 303, a transaction layer module ("TLM") 301, a configuration management module ("CMM") 307, a management block 302, and a reset block 309.

Within PCIe core 210, TLM 301 is coupled to DLM 303 for bidirectional communication, and DLM 303 is coupled to PLM 305 for bidirectional communication. Additionally, each of TLM 301, DLM 303, and PLM 305 is coupled to CMM 307 for bidirectional communication. Reset block 309 is coupled to TLM 301, DLM 303, PLM 305, CMM 307, and management block 302, though not illustratively shown in FIG. 3 for purposes of clarity. Management block 302 is coupled via a read/write interface to CMM 307.

PLM 305 is coupled to Root Complex 321 via PCIe interface 318. Additionally, PLM 305 may be coupled to system resources 323 for receiving a clock signal. Reset block 309 may be coupled to system resources 323 for receiving reset signaling. Management block 302 may be coupled to system resources 323 for dynamic configuration and status monitoring. Configuration interface 314 may couple host interface 325 to management block 302, and host interface 325 may thus be coupled to CMM 307 via configuration interface 314 and management block 302. User logic 327, which may be instantiated in FPGA fabric, is coupled to TLM 301 via transaction interface 312.

With continuing reference to FIG. 3, it should be understood that a PCIe core 210 may be what is known as an "Endpoint." Examples of applications of PCIe Endpoints include graphics cards, memory cards, and the like. In this example, a PCIe core 210 is implemented in an FPGA as an ASIC. However, user logic 327 may be configured for an application implemented with FPGA resources which would interface to such PCIe core 210. Additionally, multiple PCIe cores 210 may be coupled to a Root Complex 321 to provide a PCIe network, an example of which is described in additional detail with reference to FIG. 4 below.

Host interface 325 may be an interface to a processor of a processor block 110 of FIG. 1, namely an embedded processor, or may be a host interface to another type of host. Examples of other types of hosts include a microprocessor instantiated in FPGA fabric, such as a MicroBlaze microprocessor available from Xilinx, Inc. of San Jose, Calif. Another example of a host may be a sequencer instantiated in FPGA fabric, or other known host device that may be instantiated in FPGA fabric.

Figure 4:
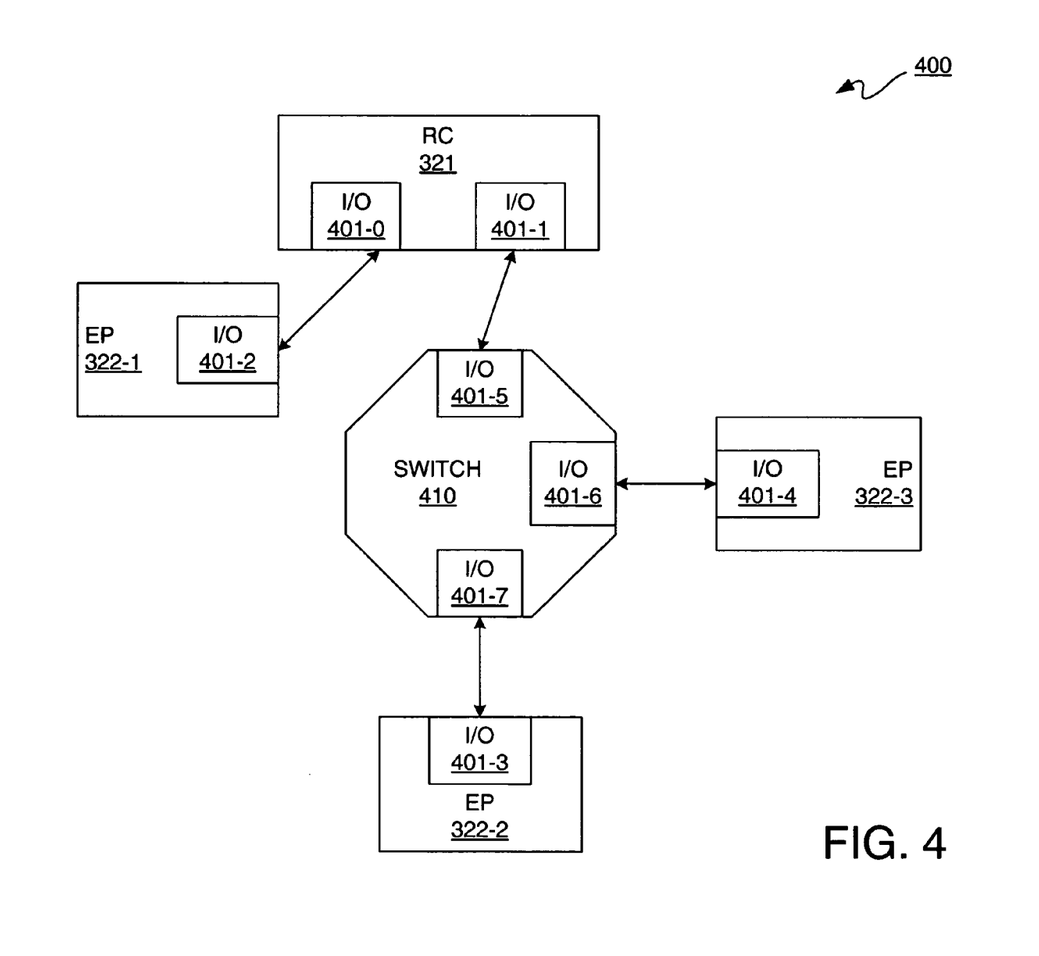
FIG. 4 is a network diagram depicting an exemplary embodiment of a PCIe network.

FIG. 4 is a network diagram depicting an exemplary embodiment of a PCIe network 400. PCIe network 400 includes Root Complexes ("RC") 321-1, and Endpoints ("EPs") 322-1 through 322-3. Although a Root Complex 321 and three Endpoints 322-1 through 322-3 are illustratively shown, it should be appreciated that fewer or more of each than four root complexes may be implemented. PCIe network 400 may be implemented using FPGAs, where switch matrix 410 is implemented using programmable interconnects, among other details described below.

Root Complex 321-1 includes I/O blocks 401-0 and 401-1. I/O block 401-0 is directly coupled to I/O block 401-2 of Endpoint 322-1. With reference to FPGA 100 of FIG. 1, I/O blocks 401-0 through 401-2 for example may be implemented using I/O 107 or MGTs 101 of FIG. 1. Moreover, I/O blocks 401-0 through 401-2 for example may be implemented using one or more IOBs 104 of FIG. 1. Root Complex 321 is coupled to Endpoints 322-2 and 322-3 via switch matrix 410. Switch matrix 410 may be implemented as a known PCIe switch block. Accordingly, switch matrix 410 may included I/O blocks 401-5 through 401-7 for respectively coupling to I/O blocks 401-1, 401-4, and 401-3, where I/O blocks 401-3 and 401-4 are respectively of Endpoints 322-2 and 322-3.

Having this understanding of a PCIe network 400 and a PCIe core 210 of FIG. 3, both of which may be implemented in an FPGA, a detailed description of an interface between a hard macro, such as PCIe core 210, and user logic instantiated in programmable logic of an FPGA is provided.

Figure 5A:
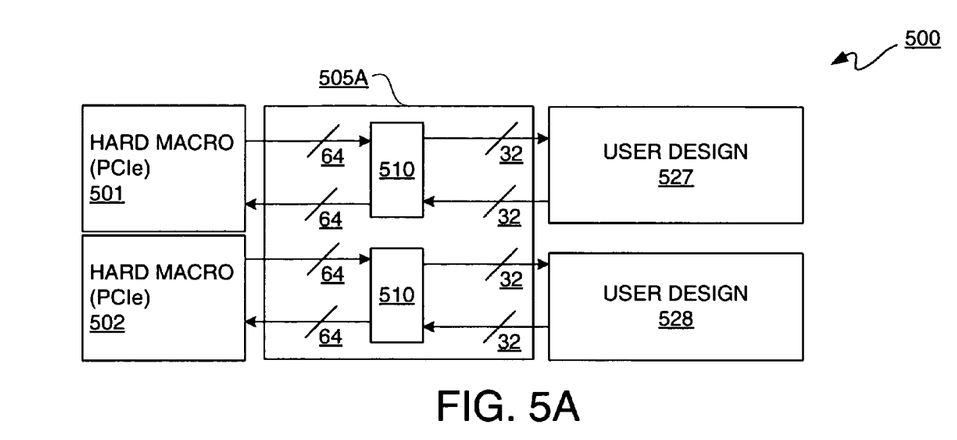
FIG. 5A is a block diagram depicting an exemplary embodiment of hard macros coupled to respective portions of a user design instantiated in programmable logic.
Figure 5B:
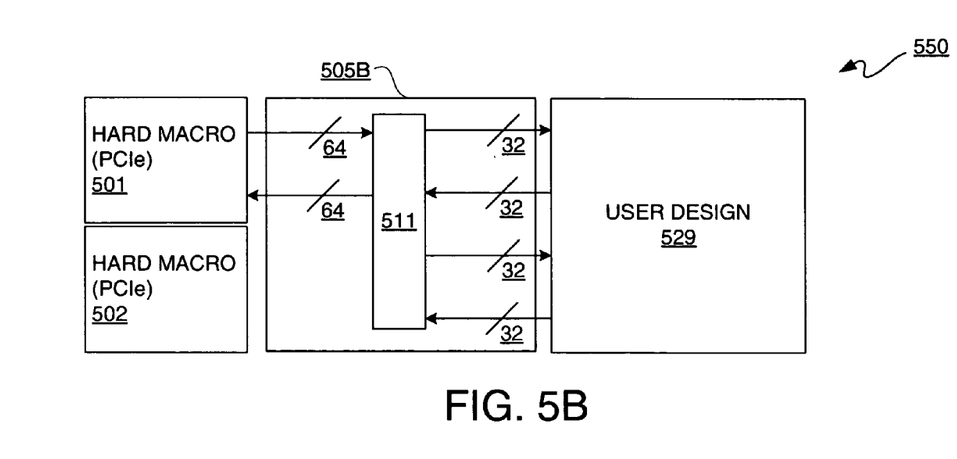
FIG. 5B is a block diagram depicting an exemplary embodiment of hard macros coupled to a user design instantiated in programmable logic.

FIG. 5A is a block diagram depicting an exemplary embodiment of interface configuration 500 for a non-bypass mode. In interface configuration 500, hard macros 501 and 502 are coupled to respective portions of a user design, namely user design 527 and user design 528. User designs 527 and 528 may be instantiated in whole or part in programmable logic, such as programmable logic of an FPGA 100 of FIG. 1, for example. Notably, hard macros 501 and 502 in the example of FIG. 5A, as well as the example of FIG. 5B, are respective PCIe hard cores ("PCIe cores"), as previously described herein. Although it is assumed that hard macros 501 and 502 are PCIe cores by way of example, it should be appreciated that one or more other known types of hard macros may be implemented, which may or may not be in combination with a PCIe core.

When placing a hard macro block into FPGA fabric, it may be useful to use routing associated with an adjacent hard macro block to provide sufficient routes for a wider bandwidth than would be available with only a single hard macro block. Another reason for sharing routing between hard macro blocks may be to share pins associated with one or more features as between hard macro blocks. Yet another reason may be to overcome physical routing constraints. Regardless of the reason, it should be appreciated that it may be desirable to operate user logic and a hard macro at same or different frequencies.

FIG. 5B is a block diagram depicting an exemplary embodiment of interface configuration 550 for a bypass mode. Interface configuration 550 includes hard macros 501 and 502 coupled to a user design 529. User design 529 may be instantiated in programmable logic, such as programmable logic of FPGA 100 of FIG. 1.

With simultaneous reference to FIGS. 5A and 5B, interface configurations 500 and 550, respectively, are further described. Notably, user designs 527 and 528, as well as user design 529, may be user logic 327 of FIG. 3. Accordingly, transaction interface 312 of FIG. 3 may be transaction interface 505A or 505B, respectively, of FIGS. 5A and 5B. Transaction interfaces 505A and 505B may include wrapper circuit blocks ("wrapper blocks") 510, which are only illustratively shown in transaction interface 505A of FIGS. 5A and 5B. Alternatively, wrapper blocks 510 of interface configurations 500 and 550 may be part of PCIe cores 501 and 502, where each of those cores includes a respective wrapper block 510.

In this example implementation, each PCIe core 501 and 502 has a native 64-bit transaction layer side interface, namely 64 input bit paths and 64 output bit paths. In FIG. 5A, PCIe cores 501 and 502 are respectively coupled to user designs 527 and 528, which may be separate parts of a single user design, via respective wrapper blocks 510. In this example, each user design has a 32-bit wide user interface, namely 32 input bit paths and 32 output bit paths. Notably, for purposes of clarity and not limitation, only data busing is described though other types of signaling associated with PCIe may be implemented. Thus respective wrapper blocks 510 allow a user interface instantiated in FPGA fabric to use half the number of pins in this example than the number of pins of the native transaction interface of a corresponding PCIe core. Because only half the native transaction interface of a PCIe core may be used, such PCIe core may be operated at approximately half the frequency of a user design associated therewith, as described below in additional detail.

In contrast, FIG. 5B does not illustratively show a separate set of 64 input pins and 64 output pins of PCIe core 502 and does not illustratively show respective wrapper blocks 510. Notably, these pins of PCIe core 502 and wrapper blocks may exist in interface 505B, but are not illustratively shown as they are not used in the bypass mode of operation illustratively shown in FIG. 5B. In FIG. 5B, user design 529 employs two sets of 32 input pins and two sets of 32 output pins for a total of 64 input pins and 64 output pins. Accordingly, bypass circuitry 511, which is not illustratively shown in FIG. 5A as it is not used in the non-bypass mode illustratively shown in FIG. 5A, is invoked to bypass wrapper blocks 510 and input and output pins of PCIe core 502. Notably, bypass circuitry 511 may be implemented using multiplexers, with control signaling to select between a bypass mode and a non-bypass mode. In FIG. 5B, a 64-bit wide interface between PCIe core 501 and user design 529 is provided.

Accordingly, it should be appreciated that PCIe cores 501 and 502 have a configurable width bus interface. In a non-bypass mode, a 32-bit data interface is presented to user logic for packet data input and output by a user of transaction interface 505A. And, in a bypass mode, a 64-bit data interface is presented to user logic for packet data input and output by a user of interface 505B. As implementation for bypass circuitry 511 should be understood by one of ordinary skill in the art, an example of such implementation is not described for purposes of clarity.

Figure 6:
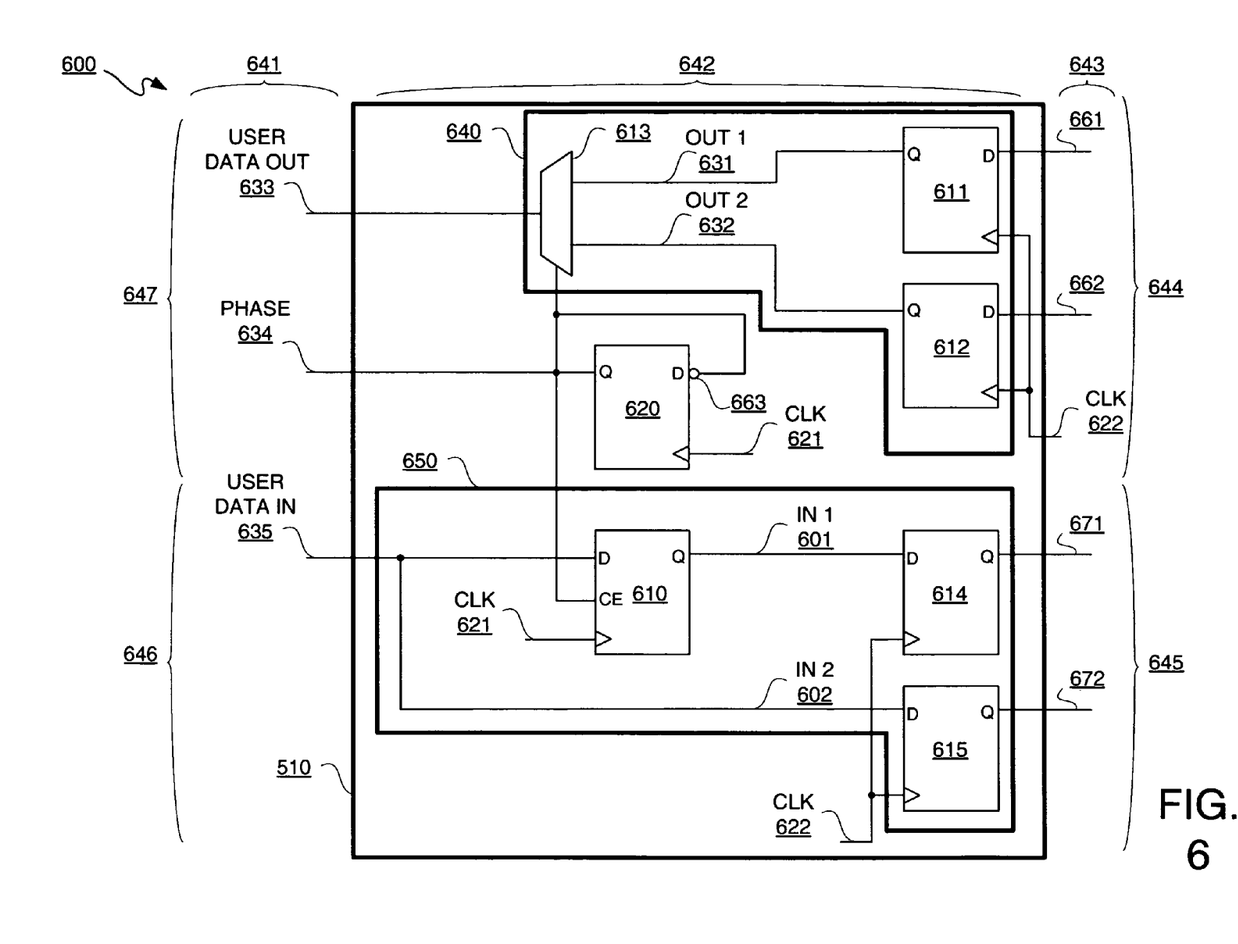
FIG. 6 is a circuit diagram depicting an exemplary embodiment of a hard macro to user logic interface configuration.

FIG. 6 is a circuit diagram depicting an exemplary embodiment of a portion of a hard macro to user logic interface configuration 600. Generally, there are three clock domains associated with interface configuration 600, namely a user logic clock domain 641, a wrapper clock domain 642, and a hard macro clock domain 643. Wrapper clock domain 642 of wrapper block 510 may include a mix of clock frequencies, where one of those mix of frequencies is associated with clock domain 641 and another one of those mix of frequencies is associated with clock domain 643. For purposes of clarity by way of example and not limitation, it shall be assumed that a portion of transaction interface 505A of FIG. 5A is being described for coupling hard macro 501 and user design 527.

For purposes of clarity by way of example and not limitation, some frequencies of operation are assumed. However, it should be understood that other frequencies, as well as other data bit widths, may be used. It shall be assumed that clock domain 641 operates at approximately 250 megahertz ("MHz"), and clock domain 643 operates at approximately 125 MHz. Furthermore, it shall be assumed that clock domain 642 associated with wrapper block 510 operates at approximately 125 MHz and at approximately 250 MHz.

Continuing the example of the PCIe core as the hard macro, as described above, it shall be assumed that PCIe core clock domain 643 is approximately a 125 MHz clock domain. However, for PCIe, approximately a 250 MHz frequency of operation may be used as is known for an eight physical lane usage, where each lane is eight bits wide. Accordingly, I/Os of PCIe core 501 may be timed for the approximate 250 MHz operation. However, because data bit width for this example is 32-bits in and 32-bits out of user design 527, namely half the available bit width of PCIe core 501, PCIe core 501 may be clocked at half of this frequency, namely approximately 125 MHz.

Interface configuration 600 includes an output data path portion 640 for passing data from a PCIe core to user logic and an input data path portion 650 for passing data from user logic to a PCIe core, respectively. With respect to output data path portion 640, a user interface-side 647 receives data out signal 633 and an associated phase signal 634. Though a single user data out signal 633 is illustratively shown as only a single instance of a portion of wrapper block 510 is shown for purposes of clarity by way of example not limitation, it should be appreciated that there are multiple instances within each wrapper block 510 of input and output data path portions 640 and 650, as shall be described in additional detail below with reference to FIG. 7.

In this example, output data path portion 640 and input data path portion 650 are coupled to one another via a control circuit portion, which in this example is implemented with a flip-flop 620. Output and input data path portions 640 and 650 are coupled to receive output from flip-flop 620.

Figure 7:
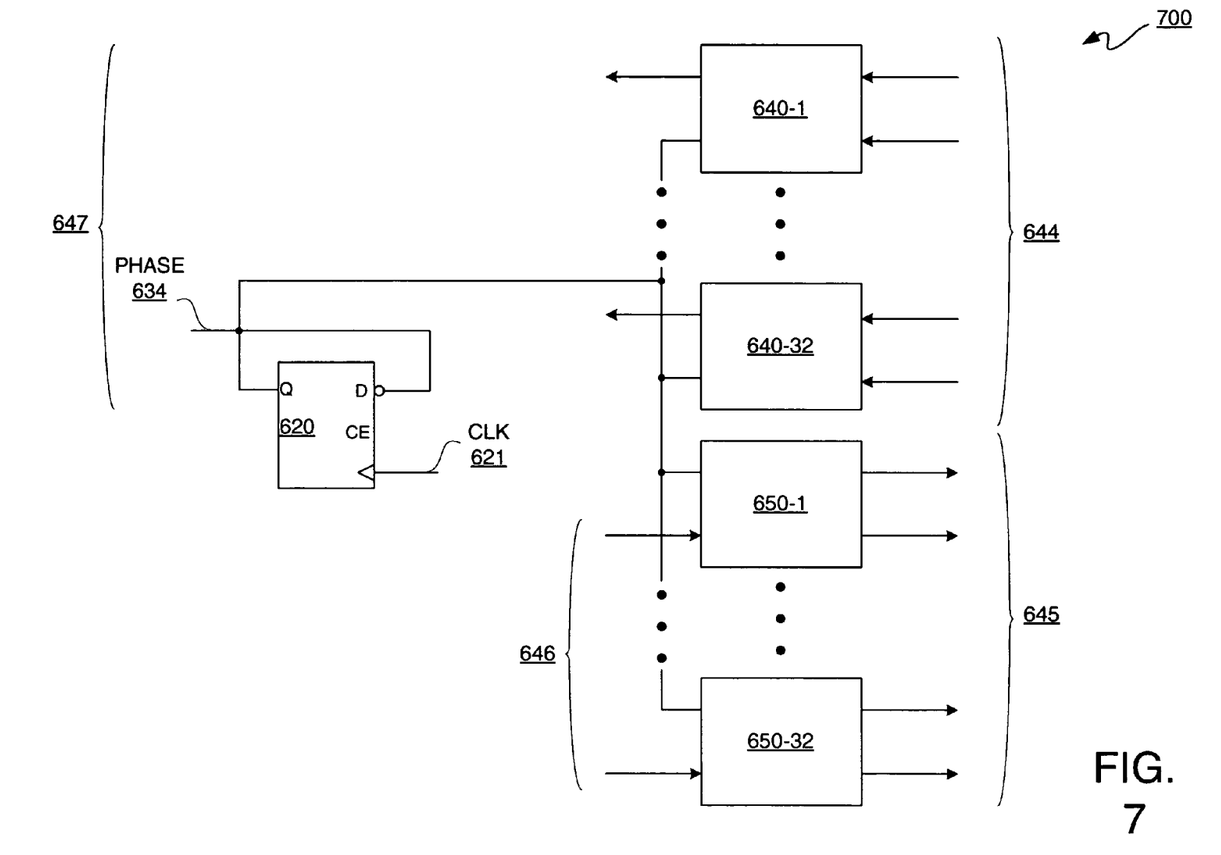
FIG. 7 is a block/circuit diagram depicting an exemplary embodiment of a wrapper circuit.

FIG. 7 is a block/circuit diagram depicting an exemplary embodiment of 32 instances of each of portions 640 and 650 of FIG. 6 for an interface configuration 700. Interface configuration 700 may be a wrapper block 510 of FIG. 6. Interface configuration 700 includes flip-flop 620 which is configured to provide a phase signal 634 to each of 32 instances of output data path portion 640, namely output data path portions 640-1 through 640-32 and to each of 32 instances of input data path portion 650, namely input data path portions 650-1 through 650-32. Notably, multiple synchronized flip-flops may be used rather than the single flip-flop 620.

Returning to FIG. 6, a PCIe core interface-side 644 is associated with an input side to output data path portion 640 of wrapper block 510. Additionally, a PCIe core interface-side 645 is associated with an output side of data input path portion 650 of wrapper block 510. A user logic interface-side 647 is associated with an output side of output data path portion 640 of wrapper block 510. Additionally, a user logic interface-side 646 is associated with an input side to data input path portion 650 of wrapper block 510.

Output data path portion 640 of wrapper block 510 includes multiplexer 613 and flip-flops 611 and 612. Input data path portion 650 of wrapper block 510 includes flip-flops 610, 614, and 615. Additionally, wrapper block 510 includes a flip-flop 620, the output of which is provided to data path portions 640 and 650 as a phase signal 634.

With reference to output data path portion 640, data is input to flip-flops 611 and 612 from respective data input signals 661 and 662 of PCIe core 501. Flip-flops 611 and 612 are clocked responsive to clock signal 622. Clock signal 622 may be obtained by dividing the frequency of clock signal 621 by two. For example, clock signal 622 may operate at approximately 125 MHz and clock signal 621 may operate at approximately 250 MHz. Notably, a clock divider circuit is not illustratively shown; however it should be appreciated that integrated circuits, such as FPGA 100 of FIG. 1, may include circuitry for dividing a clock down by two as is known.

Output of flip-flops 611 and 612 is coupled to respective data inputs of multiplexer 613. Output of flip-flop 611 is indicated as out 1 signal 631, and output of flip-flop 612 is indicated as out 2 signal 632 to indicate that these are a pair of separate data bits.

Flip-flop 620 is clocked responsive to clock signal 621, which again is approximately a 250 MHz clock signal. Flip-flop 620 may be set to an initial state such as a logic 0 or a logic 1. Output of an inverter 663 is coupled to a data input port of flip-flop 620. Output of flip-flop 620 is coupled to an input port of inverter 663, as well as being coupled to a control port of multiplexer 613 and a clock enable port of flip-flop 610.

Output of flip-flop 620 is phase signal 634. Thus, it should be appreciated that output of flip-flop 620 will toggle between logic 1 and logic 0 responsive to each leading edge of clock signal 621. Thus, for example, for a logic 1 used to select out 1 signal 631 as output from multiplexer 613, out 1 signal 631 is selected to be output from multiplexer 613 to provide user data out signal 633 on one clock signal cycle, and on the immediately following clock signal cycle, out 2 signal 632 is selected to be output from multiplexer 613 to provide user data out signal 633. Thus, user data out signal 633 output from multiplexer 613 will be a sequence of out 1, out 2, out 1, out 2, . . . as respectively associated with portions of each of signals 631 and 632. In other words, for this example, a logic 1 for phase signal 634 may be for selecting a portion of out 1 signal 631 and a logic 0 for phase signal 634 may be for selecting a portion of out 2 signal 632 which portions are respectively combined and provided via user data out signal 633. As both user data out signal 633 and phase signal 634 are synchronously provided to user design 527, user design 527 may be configured to parse data as between out 1 signal 631 and out 2 signal 632.

For information from user design 527 to PCIe core 501, user data in signal 635 may include a sequence of input data, namely for example in 1, in 2, in 1, in 2, . . . as respectively associated with in 1 signal 601 and in 2 signal 602. User design 527 may be configured to multiplex separate input data bits to a single signal, for example such as was described above with reference to output data path portion 640.

User data input signal 635 is provided to a data input port of flip-flop 610, and to a data input port of flip-flop 615. With respect to user data input signal 635 provided to a data input port of flip-flop 615, this data is indicated as in 2 signal 602 to be differentiated from in 1 signal 601 output from flip-flop 610. Output from flip-flop 610 is input to a data input port of flip-flop 614.

Flip-flop 610 is clocked responsive to clock signal 621, which as was previously indicated for this example is approximately 250 MHz. Flip-flops 614 and 615 are clocked responsive to clock signal 622, which for this example is approximately 125 MHz.

Flip-flop 610 is clock enabled responsive to output of flip-flop 620. Because flip-flop 610 and 620 are both operated responsive to clock signal 621, and because output of flip-flop 620 correspondingly toggles between a logic 0 and a logic 1, output of flip-flop 610 on one cycle will be output and on an immediately following signal will not be output. For example, when output from flip-flop 620 is a logic 1, flip-flop 610 is clock enabled responsive to such logic 1. Thus, while flip-flop 610 is clock enabled, output from flip-flop 610 is provided from user data input signal 635 responsive to clock signal 621. However, on a next cycle, output from flip-flop 620 is a logic 0, and thus flip-flop 610 is not clock enabled for that cycle. Accordingly, no output from user data input signal 635 is provided from flip-flop 610 responsive to clock signal 621 when a clock enable input is a logic low in this example.

Recall that user logic clock domain 641 operates at approximately 250 megahertz. Thus, user data in signal 635 provided as an input to flip-flop 615 is clocked out of flip-flop 615 on every other cycle, as flip-flop 615, like flip-flop 614, is clocked responsive to clock signal 622. Also recall that clock signal 622 may operate at approximately 125 MHz. By synchronizing clock signals 621 and 622 with data propagated via user data input signal 635, it should be appreciated that output of flip-flops 614 and 615 may be approximately 180 degrees out of phase. In other words, data output from flip-flop 614 may correspond to approximately one half of the data on user data in signal 635, namely data output signal 671 provided as an input to PCIe core 501, and data output from flip-flop 615 may correspond to approximately the other half of the data propagated via user data in signal 635, namely data output signal 672 provided as an input to PCIe core 501. Thus, by clocking both flip-flops 614 and 615 responsive to clock signal 622, output of flip-flops 614 and 615 may be used to provide parsed user input. In other words, as described above, user data in signal 635 is parsed into in 1 signal 601 and in 2 signal 602. In 1 signal 601 and in 2 signal 602 are respectively output from flip-flops 614 and 615 via data output signal 671 and data output signal 672, respectively, responsive to leading edges of clock signal 622.

Returning to FIG. 7, for PCIe core interface-side 644 being a 64-bit wide output, data propagated via PCIe core interface-side 644 may be provided as a 32-bit wide input to interface configuration 700, which may be wrapper block 510 of FIG. 6, for user interface-side 647 along with at least one additional input pin to user design 527 for phase signal 634. Moreover, data input to wrapper block 510 from a 32-bit wide user interface-side 646 may be converted to a 64-bit wide output from wrapper block 510 for PCIe core interface-side 645.

Accordingly, it should be appreciated that wrapper block 510 may be used to couple data bit widths of different sizes and different clock rates. Furthermore, it should be appreciated that for a user design having a smaller bit width than a hard macro, operating frequency of the hard macro may be reduced.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. An integrated circuit, comprising:
a core located in the integrated circuit as an application specific circuit block;
the core having a transaction interface;
the transaction interface having a first bit width;
programmable logic capable of being programmed to instantiate user logic, the user logic having a user interface of a second bit width substantially less than the first bit width;
a wrapper circuit coupling the user interface and the transaction interface for coupling the core to the user logic;
the wrapper circuit configured to couple first information of the first bit width from the transaction interface to the user interface; and
the wrapper circuit configured to couple second information of the second bit width from the user interface to the transaction interface;
wherein the wrapper circuit is configured to provide a phase signal to the user logic as part of the user interface; and
wherein the phase signal is provided as an output of a first control flip-flop, the first control flip-flop being clocked responsive to a first clock signal.

2. The integrated circuit according to claim 1, wherein the core is a Peripheral Component Interconnect Express core.

3. The integrated circuit according to claim 2, wherein the integrated circuit is a programmable logic device; and
wherein the wrapper circuit is part of the core.

4. The integrated circuit according to claim 1, wherein the phase signal is provided internally to an output data path and an input data path of the wrapper circuit.

5. The integrated circuit according to claim 4, wherein the output of the first control flip-flop is inverted and an inverted version of the output of the first control flip-flop is provided to a data input port of the first control flip-flop.

6. The integrated circuit according to claim 4, wherein a first block of the output data path includes a multiplexer, a first input flip-flop, and a second input flip-flop, the first input flip-flop and the second input flip-flop being coupled to receive respective data outputs of the core and clocked responsive to a second clock signal, the first clock signal having a first frequency which is substantially faster than a second frequency of the second clock signal; and
   wherein respective outputs of the first input flip-flop and the second input flip-flop are provided as data inputs to the multiplexer, the multiplexer being coupled to receive the phase signal as a control select signal.

7. The integrated circuit according to claim 6, wherein the first frequency is approximately twice that of the second frequency.

8. The integrated circuit according to claim 6, wherein a second block of the input data path includes a second control flip-flop, a first output flip-flop, and a second output flip-flop, the first output flip-flop and the second output flip-flop being clocked responsive to a second clock signal, the second control flip-flop being clocked responsive to the first clock signal, the first clock signal having a first frequency which is substantially faster than a second frequency of the second clock signal.

9. The integrated circuit according to claim 8, wherein data input ports of the second control flip-flop and the second output flip-flop are coupled to receive a bitstream from the user logic, the bitstream having first data bits and second data bits in alternating succession.

10. The integrated circuit according to claim 9, wherein the second control flip-flop is coupled to receive the phase signal as a clock activation signal.

11. The integrated circuit according to claim 10, wherein the first output flip-flop is coupled to receive data output from the second control flip-flop; and
   wherein outputs from the first output flip-flop and the second output flip-flop are provided to the core.

12. The integrated circuit according to claim 11, wherein 32 instances of the first block and 32 instances of the second block are included in the wrapper circuit.

13. A method for coupling a user design instantiated in programmable logic and a hard macro both of which are implemented in an integrated circuit, the method comprising:
   generating a phase signal, the phase signal alternating between a first logic state and a second logic state synchronously with reference to a first clock signal;
   first sending output data associated with the hard macro to a wrapper circuit the output data received in first pairs;
   wherein each first pair of the first pairs includes first output data and second output data;
   first registering the output data in the wrapper circuit responsive to a second clock signal, the second clock signal being substantially slower than the first clock signal;
   first outputting of the output data from the wrapper circuit to the user design responsive to the phase signal, the output data output from the wrapper circuit being output as first bitstreams;
   wherein each first bitstream of the first bitstreams includes a first alternating sequence of the first output data and the second output data for each of the first pairs associated therewith;
   second sending input data associated with the user design to the wrapper circuit in second bitstreams, the input data provided in second pairs;
   wherein each second pair of the second pairs includes first input data and second input data;
   wherein each second bitstream of the second bitstreams includes a second alternating sequence of the first input data and the second input data for each of the second pairs associated therewith;
   second registering a first portion of the input data in the wrapper circuit responsive to the first clock signal and the phase signal;
   third registering a second portion of the input data in the wrapper circuit responsive to the second clock signal;
   fourth registering the first portion of the input data in the wrapper circuit responsive to the second clock signal;
   second outputting of the input data from the wrapper circuit to the hard macro responsive to the second clock signal, the input data output from the wrapper circuit being output as the first input data and the second output data respectively from the fourth registering and the third registering; and
   wherein the first input data and the second input data are output from the wrapper circuit as separate signals for each of the second bitstreams.

14. The method according to claim 13, wherein the hard macro is a Peripheral Component Interconnect Express core.

15. The method according to claim 14, wherein the integrated circuit is a programmable logic device.

16. The method according to claim 15, wherein the wrapper circuit is part of the hard macro.

17. The method according to claim 16, wherein the first clock signal has a frequency which is approximately twice that of the second clock signal.

18. The method according to claim 17, wherein the user design is for a 32-bit interface and the Peripheral Component Interconnect Express core has a 64-bit interface.

* * * * *